United States Patent [19]
Tay

[11] Patent Number: 5,329,243
[45] Date of Patent: Jul. 12, 1994

[54] NOISE ADAPTIVE AUTOMATIC GAIN CONTROL CIRCUIT

[75] Inventor: Wan F. Tay, Singapore, Singapore

[73] Assignee: Motorola, Inc., Schaumburg, Ill.

[21] Appl. No.: 946,138

[22] Filed: Sep. 17, 1992

[51] Int. Cl.[5] .............................................. H03G 3/34
[52] U.S. Cl. ..................... 330/136; 332/141; 332/149; 332/279; 332/281; 455/50.1; 455/116
[58] Field of Search ............... 330/129, 136, 141, 149, 330/279, 281; 455/50.1, 116, 126, 219, 220, 223, 224, 233.1

[56] References Cited

U.S. PATENT DOCUMENTS

| | | | |
|---|---|---|---|
| 3,496,481 | 2/1970 | Torick et al. | 330/141 X |
| 3,548,334 | 12/1970 | Tomita et al. | 330/141 X |
| 3,723,897 | 3/1973 | Barnes | 330/279 |
| 3,939,428 | 2/1976 | Shimizu et al. | 455/233.1 |
| 4,052,678 | 10/1977 | Ramsland | 330/141 X |
| 4,112,384 | 9/1978 | Buchberger | 330/141 |
| 4,204,172 | 5/1980 | Ben Sadou et al. | 330/141 X |
| 4,236,116 | 11/1980 | Beseke et al. | 330/141 X |
| 4,461,025 | 7/1984 | Franklin | 455/219 X |
| 4,514,708 | 4/1985 | Maher et al. | 330/279 |
| 4,609,878 | 9/1986 | Rodgers | 330/136 |
| 4,677,389 | 6/1987 | Op de Beek et al. | 330/279 X |
| 5,016,205 | 5/1991 | Shumway | 364/715.01 |

*Primary Examiner*—James B. Mullins
*Attorney, Agent, or Firm*—M. Mansour Ghomeshi

[57] ABSTRACT

A noise adaptive automatic gain control circuit (100) includes an automatic gain control amplifier (105) for automatically adjusting the gain of the circuit (100) in response to an input signal applied to the input. A detector (135) is provided for detecting the presence of any background noise that may be present. Further, a voltage generator (126), a comparator (124), and a microcomputer (150) is provided for dynamically adjusting the gain of the AGC amplifier (105) to substantially prevent the amplification of the background noise. In other aspects of the present invention, a voice lull detector (140) detects voice lulls (402) in the input signal applied to the input. Further, a programmable amplifier (120) substantially maintains the gain of the AGC amplifier (105) to a constant level during voice lulls (402) to prevent excessive amplification.

8 Claims, 4 Drawing Sheets

NOISE ADAPTIVE AUTOMATIC GAIN CONTROL CIRCUIT

TECHNICAL FIELD

This invention is generally related to electronic circuits and more particularly to automatic gain control circuit.

BACKGROUND

Conventional automatic gain control (AGC) systems are generally designed to provide a constant output signal with an input signal that varies in amplitude over a given range. These systems are used in a variety of applications including radio communication devices. Present AGC circuits employ feedback systems to allow the gain of the circuit to vary in relationship to the input signal. As the input signal is increased or decreased, a constant level is maintained at the output. Several problems are in general encountered in typical AGC circuits. The first problems is associated with voice lulls that are present in conversational speech. Voice lulls are pauses that are present in the utterance of words. During a voice lull, the signal at the input of an AGC circuit is reduced to a very low level causing a surge in the gain of the AGC in order to maintain a constant level at the output. This surge in the gain causes annoying noise pumping which is a sudden surge in noise level. A second problem with conventional AGC systems, has to do with background noise. In applications, where background noise is high, the signal level becomes unintelligible. This is due to the fact that the gain of the amplifier does not increase according to the level of input signal because of the overriding noise power. Another problem associated with conventional AGC circuits is their dynamic range fixity. This problem is encountered when an AGC circuit is expected to operate in whisper mode (very low level signal, hence very high gain) or high noise mode (high level signals, hence low gain). The deficiencies of the prior art have limited the use of AGC circuits, particularly in portable and mobile communication devices. It can therefore be appreciated that a need exists for an AGC circuit that overcomes the deficiency of the prior art.

SUMMARY OF THE INVENTION

Briefly, according to the invention, a noise adaptive automatic gain control circuit having an input is disclosed. The AGC circuit includes an automatic gain control amplifier for automatically adjusting the gain of the circuit in response to an input signal applied to the input. A detector means is provided for detecting the presence of any background noise that may be present. Further, a means is provided for dynamically adjusting the gain of the amplifier to substantially prevent the amplification of the background noise. In other aspects of the present invention. A voice lull detector means is provided for detecting voice lulls in the input signal applied to the input. Further, a means is provided for substantially maintaining the gain of the amplifier to a constant level during voice lull to prevent excessive amplification.

DETAILED DESCRIPTION OF THE PREFERRED EMBODIMENT

Figure 1:
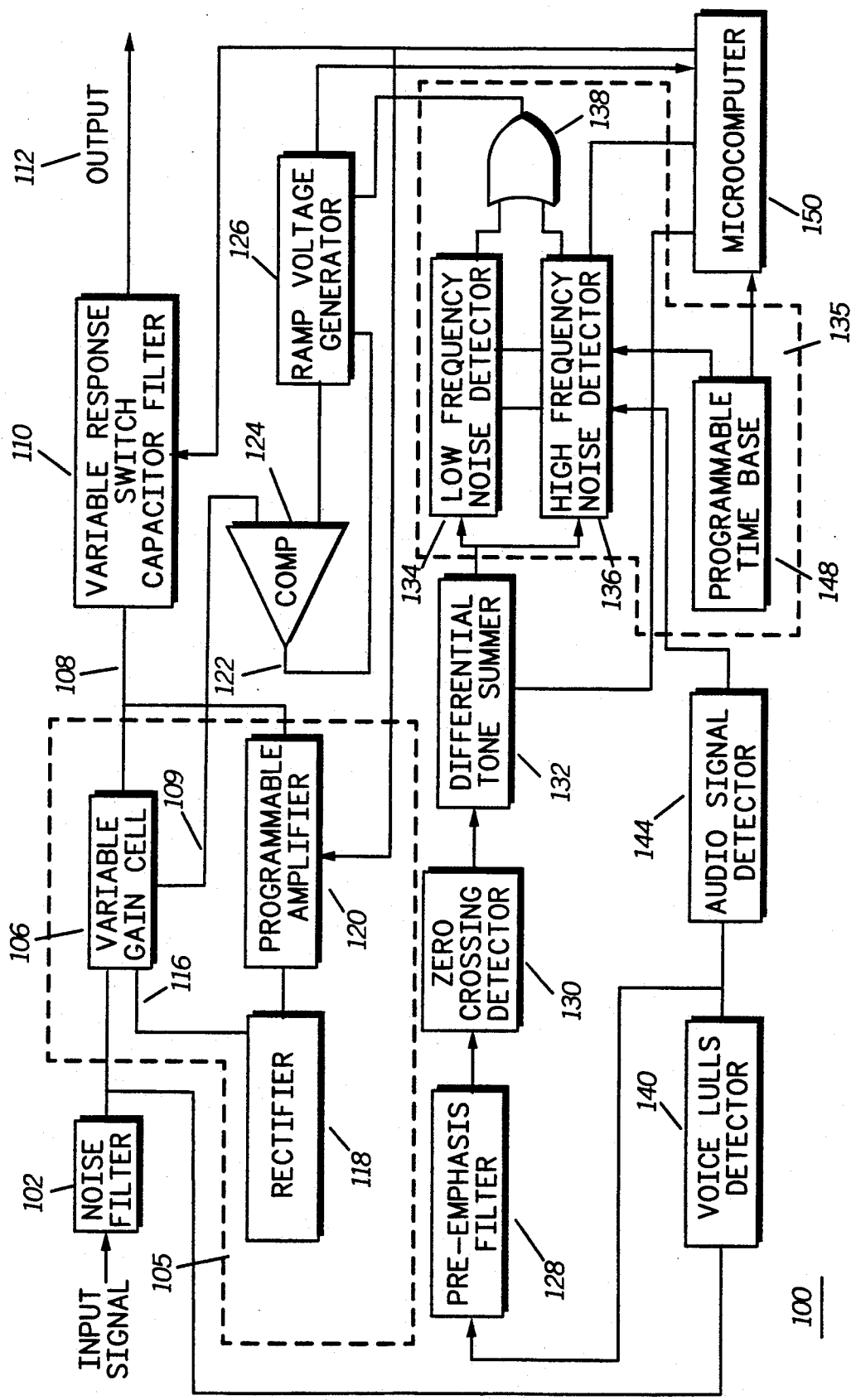
FIG. 1 is a block diagram of an noise adaptive AGC in accordance with the present invention.

Referring to FIG. 1 a block diagram of a noise adaptive Automatic Gain Control (AGC) circuit 100 in accordance with the present invention is shown. An input signal, typically voice, is initially amplified and bandpass filtered via a filter 102. The filter 102 is preferably a switch capacitor noise filter having a bandpass region from 300 Hz to 3 KHz. The output signal from the filter 102 is coupled to a variable gain cell 106 and a voice lull detector 140. The variable gain cell is part of an AGC amplifier 105 further including a rectifier 118, with its associated capacitor 114 and a programmable amplifier 120. The AGC amplifier 105 is a high dynamic range variable gain cell that has a built in gain control circuitry as well as dynamic range control circuitry. The dynamic range of the AGC amplifier 105 can be changed by programming the switch capacitor amplifier 120. The programming of the amplifier 120 is accomplished via a microcomputer 150.

Figure 2:
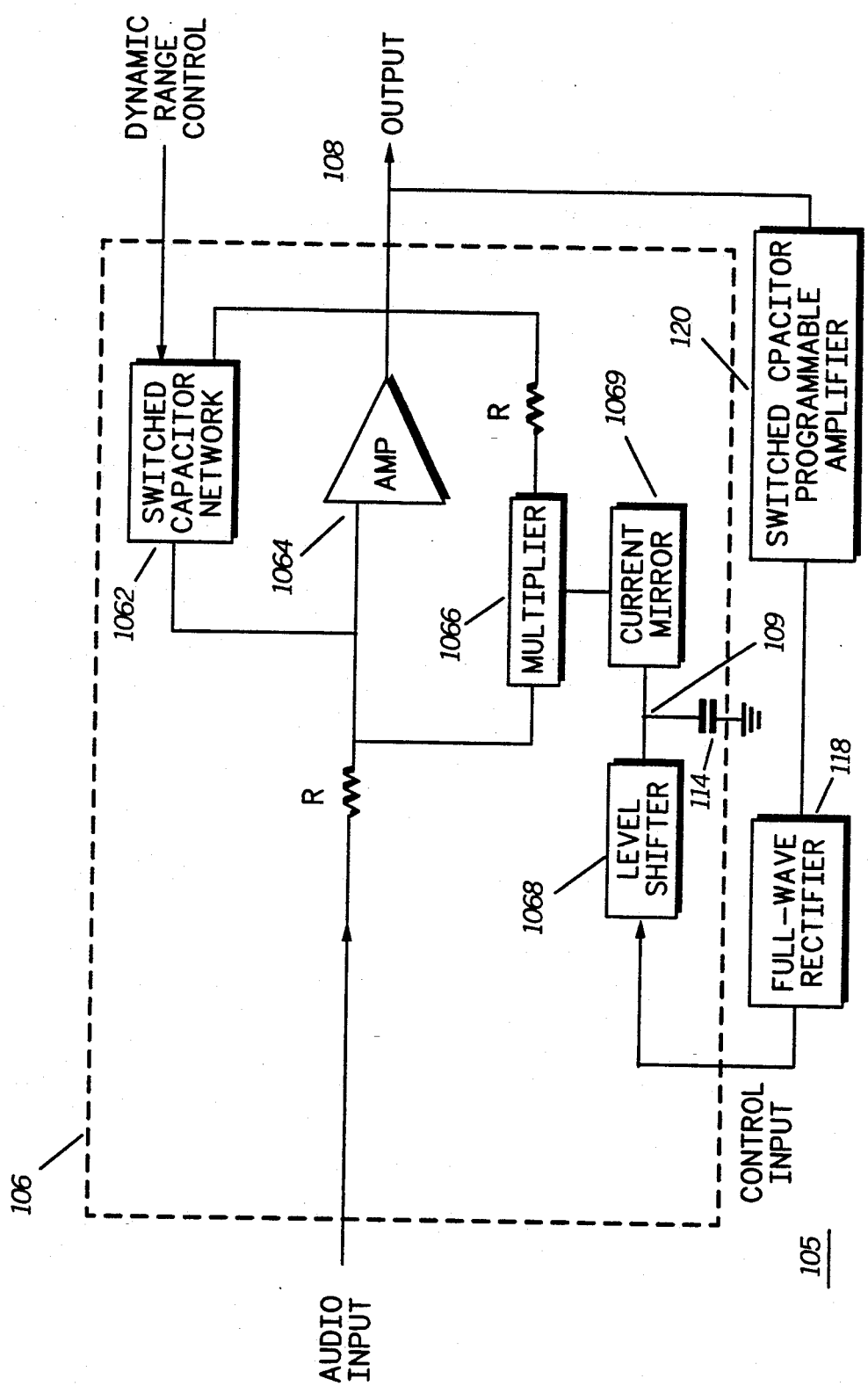
FIG. 2 is a block diagram of an AGC amplifier in accordance with the present invention.

The voltage gain cell 106 is a variable gain amplifier whose gain is controlled by a current source. The elements of the cell 106 are shown in FIG. 2. As can be seen by referring to FIG. 2, the cell 106 includes a voltage multiplier 1066, and a variable gain switch capacitor amplifier 1064, a current mirror 1069, and a level shifter 1068. The dynamic range of the AGC amplifier 105 can be changed by programming the switch capacitor circuit 120. The current mirror 1069 is used to control the current source which drives the multiplier 1066 and varies its gain. The amplified audio signal 108 is applied to the feedback control loop consisting of the amplifier 120 and the rectifier 118. At the output of the rectifier 118, an amplified and full wave rectified feedback control signal 116 is available which is routed to the variable gain cell 106 and a first input of the comparator 124. The rectified signal 116 is level shifted and applied to a storage capacitor 114 via a current source. This process converts the rectified signal to a DC level to control the current mirror circuit 1069 which in turn controls the gain of the gain cell 106.

During normal operation, the AGC amplifier 105 adjusts its gain according to the input signal level. The dynamic range of the AGC amplifier 105 is set to maximum. This range can be set to other values by programming the amplifier 120 via the microcomputer 150. The ability to change the dynamic range of the AGC amplifier 105 is useful for whisper mode operation in surveillance applications where a wider dynamic range is desired. Another benefit of the changeability of the dynamic range of the AGC amplifier 105 is realized when the background noise is high. Under these circumstances, the dynamic range can be narrowed to prevent the unnecessary amplification of the background noise. Without this adjustment, the background noise overcomes the dynamic range of the AGC amplifier 105 which results in high noise levels at the output of the AGC circuit 100.

In addition, during normal operation the storage capacitor 114 is free to be charged or discharged according to a conventional control loop. The attack time of the AGC amplifier 105 is chosen to be very fast. Its release time is chosen such that a low amplitude voice signal will be amplified fast enough to be heard, and not miss out any portion of the audio. The AGC control loop is permitted to vary as a conventional system to maintain a constant audio output. In the absence of voice, however, it is desired to prevent the AGC gain from increasing to an unacceptable level. This situation can also occur under voice lull condition, where the voice amplitude is very low. The increased gain of the AGC will result in noise pumping where the amplification of the noise is increases to an unacceptable level.

Figure 4:
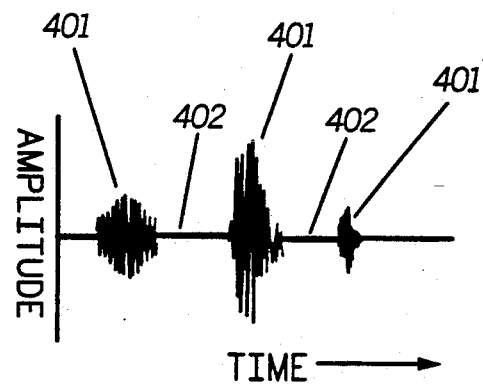
FIG. 4 shows voice lulls by capturing oscillograph envelope traces of the word "start".

As is known, "voice lulls" are the short pauses in the utterance of words that are not detected by human beings but are detected by electronic devices. These voice lulls are always present in between voice messages in a normal speech message. As an example, FIG. 4 shows oscillograph envelope traces of the word "start", showing segmentation into acoustic syllables at the amplitude pauses between acoustic syllables. Acoustic syllables 401 are separated by voice lulls 402. During these voice lulls 402, the AGC action will tend to increase the amplifier gain excessively. This results in what is known as the noise pumping effect.

In order to eliminate the noise pumping effect, an ALC circuit is necessary. The ALC circuit consists of the voice lulls detector 140, noise pre-emphasis filter 128, a zero crossing detector 130, a dual tone summer 132 and a Schmidt trigger zero crossing detector 130. The function of the voice lulls detector 140 is to sense voice peaks which exceed a predetermined threshold while ignoring the syllabic rate voice lulls which occur subsequent to a detected voice peak. That is, voice lulls which occur during a normal syllable of speech, such as those shown in FIG. 4, are ignored by the detector 140 after detecting the peak.

The voice lulls detector 140 is a dual gain peak detector. When voice is present, the gain of the detector 140 is automatically cutback to a low constant level via an AGC loop formed by the programmable amplifier 120, the rectifier 118, and the microcomputer 150. The AGC loop within the variable gain cell 106 incorporates a timing and gain control capacitor 114. This capacitor 114 stores the charge when under low gain condition. The time constant can be adjusted according to the duration of the voice lulls. When the voice lulls occur, the capacitor 114 will hold the charge necessary to maintain a low gain so that the output from the detector 140 does not trigger a Schmidt trigger 130 following it.

A pre emphasis filter 128 couples the voice lull detector 140 to the Schmidt trigger 130. The function of the pre emphasis filter 128 is to amplify a desired segment of the noise spectrum suitable for the detection of background noise. The schmidt trigger 130 drives a differential tone summer 132 which sums the output signal of the schmidt trigger 130 to a reference clock, preferably 16.4 KHz, from the microcomputer 150. The differential tone summer 132 provides a 16.4 KHz signal if there is no signal output from the Schmidt trigger 130. On the other hand, if a signal is present, then it will output a clock signal that has the frequency of the input signal and suppresses the 16.4 KHz signal. The output of the differential tone summer 132 is applied to a noise/voice detector 135 comprising a programmable time base 148, a low frequency noise detector 134, a high frequency noise detector 136, and an Exclusive OR (EXOR) gate 138. The programmable time base 148 sets the lower frequency limit F1 and the upper frequency limit F2 of the noise detectors 134 and 136. The programming time base 148 is programmed via the microcomputer 150. Typically, frequencies below 300 Hz and above 3 KHz are treated as noise. This frequency range is user programmable according to the background noise environment and usable audio frequency range required.

At the noise/voice detector circuitry 135 a 16.4 KHz signal, a signal whose frequency is lower than F1, or a signal whose frequency is higher than F2 will be treated as noise. The noise/voice detector output at the output of the EXOR gate 138 is applied to a latching circuit which will be set to a logic high if noise is present or to a logic low if voice is present. Subsequently, a logic low sets the AGC amplifier 106 to its normal mode of operation. i.e., the AGC gain is allowed to vary according to the input signal level so as to maintain a constant output, and the dynamic range is set to its preset value programmed by the microcomputer 150. A logic high signal which indicates that noise is present will set the dynamic range of the AGC amplifier 106 to a lower value thereby limiting its maximum gain.

Figure 3:
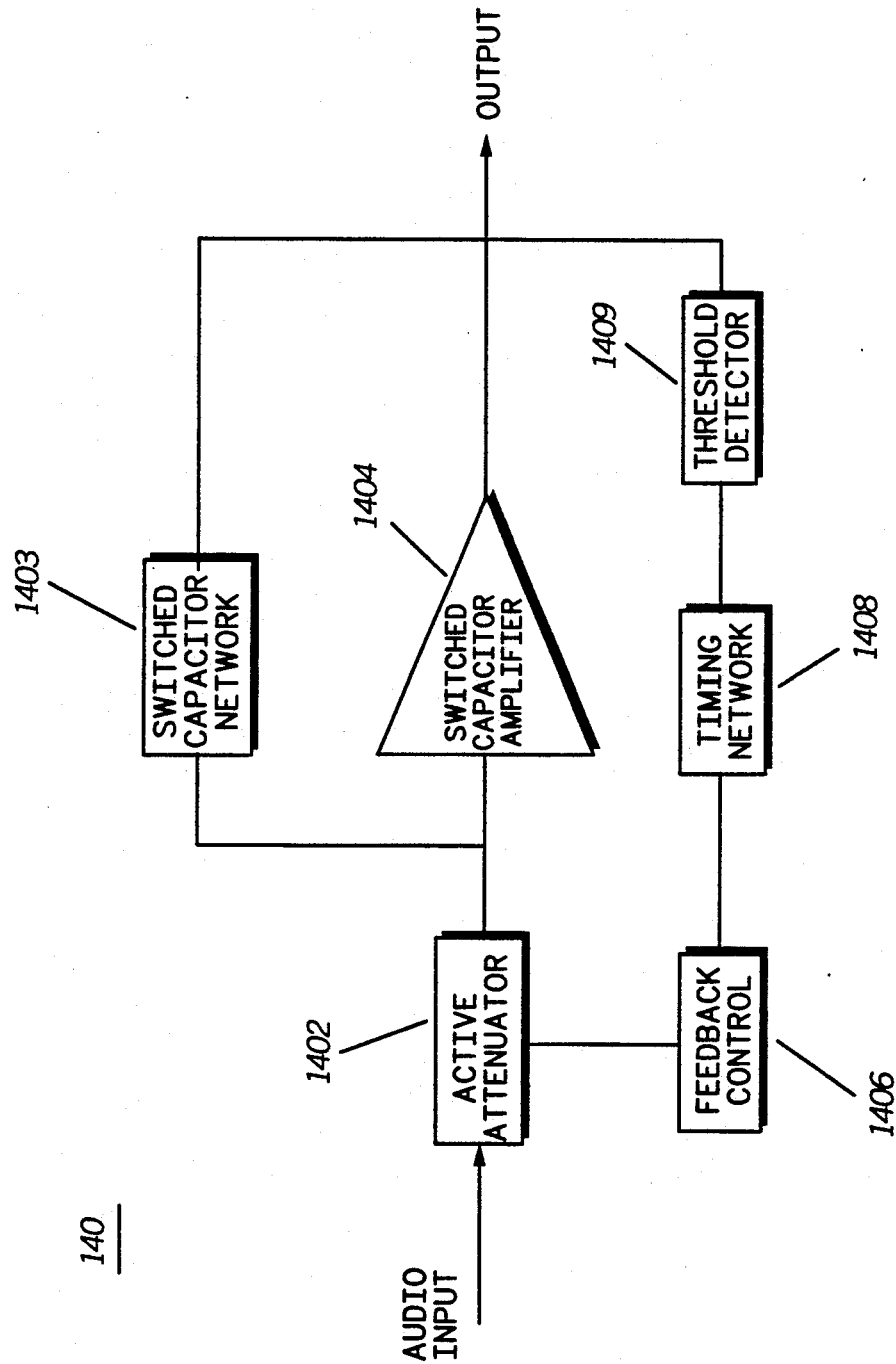
FIG. 3 is a voice lull detector circuit in accordance with the present invention.

Referring to FIG. 3, the elements of the voice lulls detector 140 in accordance with the present invention are shown. The voice lulls detector 140 includes an active attenuator 1402, followed by a switched capacitor amplifier 1404. A feedback loop consisting of a threshold detector 1409, a timing network 1408, and a feedback control circuit 1406 couples the output of the amplifier 1404 to the attenuator 1402. If the input signal is below a predetermined level, the gain of the amplifier 1404 is at its maximum. In the presence of voice exceeding a predetermined level, the gain of the detector is automatically cutback to a low constant level. The gain cutback is achieved by the threshold detector circuit 1409 which drives the time constant network 1408. The time constant network 1408 comprises of an RC network whose capacitive component stores the charge to maintain a low gain condition. The time constant of the timing network 1408 can be adjusted according to the duration of the voice lulls. In the preferred embodiment, the attack time of the timing network 1408 is set to 60 ms and the decay time is set to 2 seconds. When voice lulls occur, the capacitive element of the timing network 1408 will hold the charge necessary to maintain a low gain so that the output level from the voice lull detector 140 does not trigger the zero crossing detector 130.

Accordingly, detection of the peak during voice reception causes the signal on the noise/voice output of the EXOR gate 138 to go high. However, since the voice lulls immediately following the peak are not detected, the signal on the Noise/voice detector output 74 goes low to keep the gain applied to the input signal from increasing.

As can be seen in FIG. 1, the output of the voice lulls detector 140 is also coupled to an audio signal detector 144. The function of the audio signal detector 144 is to detect the presence of audio signals which exceed above a threshold voltage. In the preferred embodiment, the audio signal detector 144 is a Schmidt trigger circuit with a preset threshold voltage. If no signals are sensed, by the detector 144, it is assumed that voice is absent, hence a high is produced at the output. This output is coupled to the noise/voice detector 135 which produces a low to the ramp voltage generator 126. This is to keep the AGC portion of the system from increasing its gain.

When the audio detector 144 senses the presence of noise or voice activity, it outputs a low to the noise/voice detector 135 indicating that an audio signal is present. The nature of this audio signal, whether it is voice or noise, is determined by the noise/voice detector 135. To determine whether voice or noise is present, the signal output from the voice lulls detector 140 is coupled to the noise pre emphasis filter 128, to enhance the noise characteristic. The filtered output is then coupled to the dual tone summer 132. A second reference clock signal is coupled into the summer 132 from the microcomputer 150. In the presence of audio, the differential dual tone summer 132 produces an output tone whose frequency resemble that of the incoming audio signal. On the other hand, when noise is present, the tone summer 132 outputs a signal having the frequency of the reference clock supplied by the microcomputer 150. The output of the tone summer 132 is coupled to the noise/voice detector 135 where the presence of noise or voice is detected. The presence of either a high frequency noise or low frequency noise will cause the noise/voice detector 135 to output a low. This low signal prevents the gain of the AGC 105 from increasing. At the same time it will set the cutoff frequency of a variable filter 110 to a lower frequency and reduce the dynamic range of the AGC amplifier 105.

The low frequency noise detector 134 detects the presence of noise below a certain frequency programmable via the microcomputer 150. The high frequency noise detector 136 detects the presence of the noise above a certain frequency programmable by the microcomputer 150. Typically, the energy content of the voice has a predominant frequency spectrum between 300 to 3000 Hz. In the preferred embodiment, signals outside this spectrum are treated as noise. The noise detector 135 threshold frequencies are once again programmable via the microcomputer 150 for flexibility in the frequency spectrum of a voice signal. In the preferred embodiment, the threshold frequency of the low frequency noise detector 134 can be programmed from 100 to 600 Hz. The threshold frequency of the high frequency noise detector 136 can be programmed from 1000 Hz to 3500 Hz. This flexibility allows the voice frequency spectrum to be changed according to the needs of the user. The frequency information related to all the components is stored in a memory that may be a part of the Microcomputer 150.

Once a voice lull is detected, the ramp generator 126 generates a ramping voltage. A comparator 124 compares the output of the ramp voltage and the voltage at the storage capacitor 114. If the ramp voltage is equal to voltage of the capacitor 114, then the comparator 124 outputs a signal to hold the voltage at the output of the ramp generator 126. The function of the variable frequency response switched capacitor filter 110 is to provide additional filtering of the high frequency noise to improve the voice intelligibility under high ambient noise. In normal operation, the filter corner frequency is typically set to 3 KHz, and when high frequency noise is detected, the corner frequency is set to a lower frequency. The changing of the corner frequency of the filter 110 adapts the AGC circuit 100 to the background noise, hence improving voice intelligibility. The two corner frequencies of the filter 110 are programmable via the microcomputer 150. The output of the filter 110 is the output 112 of the circuit 100.

Figure 5:
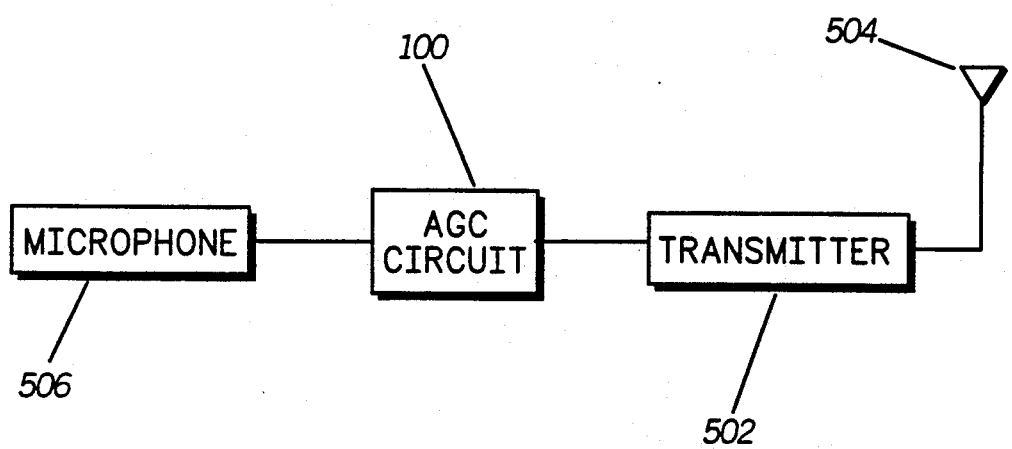
FIG. 5 is a communication device in accordance with the present invention.

Referring to FIG. 5, a block diagram of a communication device 500 in accordance with the present invention is shown. A transmitter 502 is coupled to a microphone 506 via the AGC circuit 100. The microphone 506 converts voice sounds to electrical signals and then applies them to the AGC circuit 100. The AGC circuit 100 amplifies the microphone signal and cancels noise in accordance with the present invention. Furthermore, voice lulls are detected and prevented from causing excessive amplification at the input of the transmitter. The signals at the out put of the AGC circuit are coupled to the transmitter 502 were they are used to modulate a carrier signal using techniques well known in the art. The transmitter signal is then coupled to an antenna 504 for transmission.

In summary, the circuit 100 incorporates an adaptive AGC in which the AGC dynamic range changes according to the background noise. Two actions are taken place in the presence of noise. First, the dynamic range of the AGC amplifier 105 is reduced to limit the maximum gain thereby reducing the noise pumping effect. Secondly, the filter bandwidth of the audio path is reduced to cut back upon the detection of the high frequency noise. This improves the intelligibility of the audio quality. The noise filter bandwidth is programmable via the microcomputer 150, so that it can be adjusted to adapt to the noise environment of a particular user. In addition to minimizing the effect of background noise, the voice lull detector 140 holds the gain of the AGC amplifier 105 at a constant level equal to its previous values during voice lulls in order to prevent the amplification of these voice lulls which would otherwise result in annoying noise pumping.

What is claimed is:

1. A communication device, comprising:
    a transmitter having an audio port;
    a noise adaptive automatic gain control circuit coupled to the audio port of the transmitter, the automatic gain control circuit comprising:
        an automatic gain control amplifier for automatically adjusting the gain of the circuit in response to the level of an input signal;
        voice lull detector means for sensing peaks in the input signal which exceed a predetermined threshold in order to detect short pauses in the utterance of a word the voice lull detector means including;
            an active attenuator;
            an amplifier coupled to the active attenuator, and having an output;
            a feedback circuit having a threshold detector for coupling the output of the amplifier to the active attenuator;
        means for substantially maintaining the gain of the automatic gain control amplifier during the short pauses to prevent excessive amplification of the short pauses.

2. The communication device of claim 1, further including a differential tone summer coupled to the voice lull detector means.

3. The communication device of claim 1, further including a high frequency noise detector coupled to the voice lull detector means.

4. The communication device of claim 1, further including a low frequency noise detector coupled to the voice lull detector means.

5. The communication device of claim 1, wherein the means for substantially maintaining includes a charge circuit for maintaining the charge at levels prior to voice lulls.

6. The communication device of claim 1, wherein the voice lull detector means includes a switched capacitor filter.

7. The communication device of claim 1, wherein the automatic gain control amplifier includes an amplifier having an adaptively adjustable dynamic range.

8. An automatic gain control (AGC;) circuit, comprising:
   a noise adaptive AGC amplifier;
   noise pump eliminator means for eliminating noise, including:
      an automatic level control (ALC) circuit;
      a voice lull detector for sensing peaks which exceed a predetermined threshold in order to determine voice lulls; the voice lull detector means including:
         an active attenuator;
         an amplifier coupled to the active attenuator, and having an output;
         a feedback circuit having a threshold detector for coupling the output of the amplifier to the active attenuator;
         a reference clock generator for generating a reference signal; and
         a differential tone summer coupled to the reference clock generator and the voice lull detector;
      a voice detector coupled to the differential tone summer; and
      whereby the reference signal is coupled to the voice detector when a voice lull has been detected.

* * * * *